(12) United States Patent
Coffin et al.

(10) Patent No.: US 7,319,591 B2
(45) Date of Patent: Jan. 15, 2008

(54) OPTIMIZED THERMALLY CONDUCTIVE PLATE AND ATTACHMENT METHOD FOR ENHANCED THERMAL PERFORMANCE AND RELIABILITY OF FLIP CHIP ORGANIC PACKAGES

(75) Inventors: Jeffrey T. Coffin, Pleasant Valley, NY (US); Michael A. Gaynes, Vestal, NY (US); David L. Questad, Hopewell Junction, NY (US); Kamal K. Sikka, Poughkeepsie, NY (US); Hilton T. Toy, Hopewell Junction, NY (US); Jamil A. Wakil, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 10/908,796

(22) Filed: May 26, 2005

(65) Prior Publication Data
US 2006/0268521 A1   Nov. 30, 2006

(51) Int. Cl.
*H05K 7/20* (2006.01)
(52) U.S. Cl. .................................................. 361/705
(58) Field of Classification Search ................ 361/705, 361/737, 801; 257/778, 783, 788; 438/108, 438/118, 127
See application file for complete search history.

(56) References Cited

U.S. PATENT DOCUMENTS 4,939,570 A * 7/1990 Bickford et al. ............ 257/722
5,081,067 A * 1/1992 Shimizu et al. ............ 228/123.1
6,774,493 B2 * 8/2004 Capote et al. ............... 257/778
6,806,567 B2 * 10/2004 Hembree ..................... 257/707
2002/0135052 A1 9/2002 Alcoe et al.
2003/0001248 A1 1/2003 Alcoe et al.

FOREIGN PATENT DOCUMENTS

| JP | 05-206340 | 8/1993 |
|----|-----------|--------|
| JP | 09-083165 | 3/1997 |
| JP | 11-163231 | 6/1999 |
| JP | 2003-68949 | 3/2003 |

* cited by examiner

Primary Examiner—J. F. Duverne
(74) Attorney, Agent, or Firm—Gibb & Rahman, LLC; Joseph Petrokaitis, Esq.

(57) ABSTRACT

Disclosed are thermally conductive plates. Each plate is configured such that a uniform adhesive-filled gap may be achieved between the plate and a heat generating structure when the plate is bonded to the heat generating structure and subjected to a temperature within a predetermined temperature range that causes the heat generating structure to warp. Additionally, this disclosure presents the associated methods of forming the plates and of bonding the plates to a heat generating structure. In one embodiment the plate is curved and modeled to match the curved surface of a heat generating structure within the predetermined temperature range. In another embodiment the plate is a multi-layer conductive structure that is configured to undergo the same warpage under a thermal load as the heat generating structure. Thus, when the plate is bonded with the heat generating structure it is able to achieve and maintain a uniform adhesive-filled gap at any temperature.

10 Claims, 10 Drawing Sheets

OPTIMIZED THERMALLY CONDUCTIVE PLATE AND ATTACHMENT METHOD FOR ENHANCED THERMAL PERFORMANCE AND RELIABILITY OF FLIP CHIP ORGANIC PACKAGES

BACKGROUND OF THE INVENTION

1. Field of the Invention

The present invention relates to a thermally conductive plate adapted to form a uniform adhesive-filled gap with a heat generating structure that warps when subjected to temperatures within a predetermined temperature range.

2. Description of the Related Art

An organic flip chip package, including a flip chip on a multi-layer carrier, inherently warps within a predetermined temperature range because of the coefficient of thermal expansion (CTE) mismatch between the flip chip and the multi-layer carrier. This chip warpage can be in excess of 60 microns (μm). If a flat thermally conductive plate is attached to the back surface of a chip with a thermally conductive adhesive, an uneven adhesive-filled gap will result between the warped chip and the flat thermally conductive plate. Specifically, the gap between the chip and the plate may be thinner at the center of the chip than at the edges of the chip and, thus, the portion of the adhesive at the edges of the warped chip may be stretched relative to the portion of the adhesive at the center of the chip. The varying thickness of the gap and, thus, the adhesive, can result in additional thermal resistance and higher temperatures at the chip edges and corners. Additionally, the adhesive may be stressed beyond its break point.

SUMMARY OF THE INVENTION

Disclosed are two thermally conductive plates (e.g., heat spreaders). Each of the plates are adapted to form uniform adhesive-filled gap with a heat generating structure that warps when subjected to temperatures within a predetermined temperature range. Disclosed are also the associated methods of forming the plates and the associated methods of bonding the plates to the heat generating structures.

One embodiment comprises determining a curvature of a heat generating structure (e.g., a chip attached to a carrier) when the heat generating structure is subjected to a predetermined temperature range (e.g., the normal operating temperature range of the chip). Then, based upon this curvature, a curved thermally conductive plate is formed. The plate comprises a monolithic single layer structure. A curvature of the plate matches the curvature of the heat generating structure so that when the heat generating structure is bonded to the thermally conductive plate and subjected to the predetermined temperature range a uniform gap is formed between the two structures. In order to bond the heat generating structure to the thermally conductive plate, thermally conductive adhesive in liquid form is dispensed in the gap between the heat generating structure and the thermally conductive plate. The liquid thermal adhesive is selected such that it has a curing temperature that is approximately equal to a temperature above the predetermined temperature range at which the heat generating structure becomes flat. The liquid thermal adhesive is gelled at a selected temperature within predetermined temperature range. A catalyst can be added to the liquid adhesive to speed up the gelling process (e.g., to less than 4 hours and preferably to less than 1 hour). After the liquid adhesive has gelled, it is cured. In order to cure the adhesive, the temperature of the adhesive is gradually increased from the selected gelling temperature to the curing temperature. Avoiding an abrupt temperature change to the curing temperature prevents any damage to the adhesive in the gap that may result from tensile stress as the heat generating structure becomes flat in response to the curing temperature. A thermally conductive plate that is formed in this manner will allow for a uniform adhesive-filled gap to be formed between the plate and the curved heat generating structure operating within the predetermined temperature range.

Another embodiment also comprises determining the curvature of a heat generating structure when the heat generating structure is subjected to a predetermined temperature range. Then, based upon this curvature, the unique thermally conductive plate is formed. The thermally conductive plate comprises a multi-layer conductive structure that is configured to bend in a similar manner as the heat generating structure in response to varying temperatures, including the predetermined temperature range and a temperature above the predetermined temperature range at which the heat generating structure becomes flat. Specifically, the plate is configured such that the curvature of the thermally conductive plate continuously matches the curvature of the heat generating structure. More particularly, the multi-layer conductive structure comprises a first conductive layer bonded to a second surface. Each of the layers has a predetermined thickness and coefficient of thermal expansion. The conductive layers may be bonded using a thermal adhesive, or directly bonded (e.g., by friction welding, sputtering, or plating of one material onto the other). The conductive layers are selected such that the coefficient of thermal expansion of the second conductive layer is less than that of the first conductive layer. If a thermal adhesive bonds the layers together, the adhesive should be selected such that it has a glass transition temperature (Tg) that is approximately equal to a given temperature above the predetermined temperature range at which the heat generating structure becomes flat (i.e., approximately equal to the stress free reference temperatures of the heat generating structure). The selected Tg can effect whether the thermally conductive plate bends at the same temperatures as the heat generating structure. The manner in which the multi-layer structure bends is a function of the predetermined thicknesses of each conductive layer, the relative differences between the coefficients of thermal expansion (CTE) of each of conductive layer, and the material properties of any adhesive used to bond the layers (e.g., modulus, CTE, Tg, etc.). In addition, the multi-layer structure may comprise at least one additional conductive layer disposed between the first conductive layer and the second conductive layer. The additional conductive layer is selected such that is has a lower coefficient of thermal expansion relative to that of the first and second conductive layers. The additional conductive layer, thereby, lowers the thermal resistance between the first and second conductive layer. An additional conductive layer having a thickness of less than, for example, approximately 0.1 microns can be deposited onto the first conductive layer by either a sputtering technique or by an evaporation technique. An additional conductive layer having a thickness of greater than approximately 0.1 micron may be formed on the first conductive layer by applying a sol-gel process. Once the thermally conductive plate is formed, it is bonded to the heat generating structure (e.g., a chip surface). A flip chip package that is formed according to this method will have uniform adhesive-filled gap continuously maintained between the thermally conductive plate (e.g., heat spreader) and the heat generating structure (e.g., chip) regardless of the temperature.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIGS. 1b-d are schematic drawings illustrating a process of thermally bonding a thermally conductive plate to the heat generating structure of claim 1a;

DETAILED DESCRIPTION OF PREFERRED EMBODIMENTS OF THE INVENTION

Figure 1A:
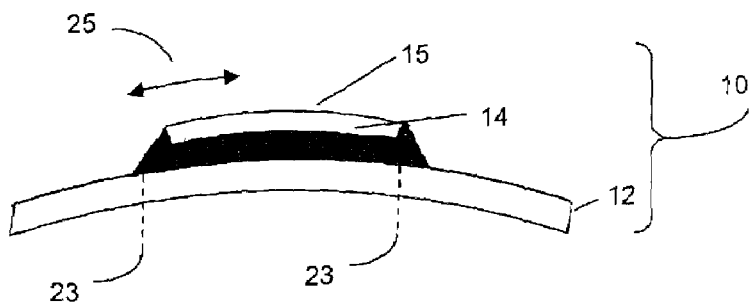
FIG. 1a is a schematic drawing illustrating warpage of a heat generating structure at operating temperatures.
Figure 1B:
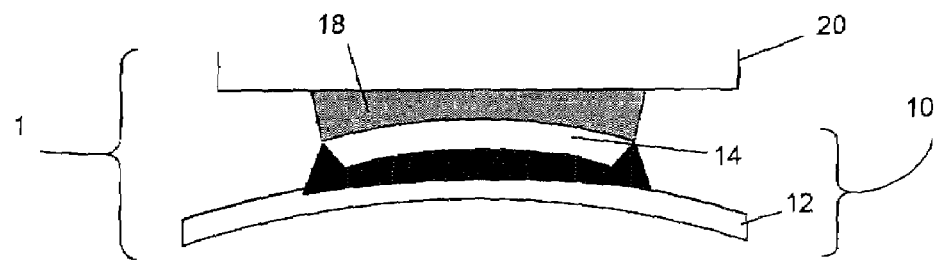
Figure 1C:
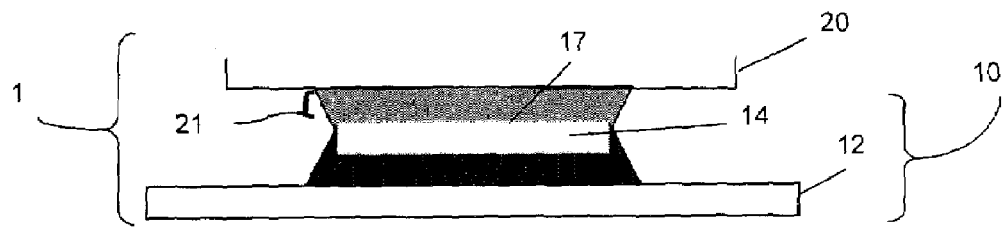

Referring to FIGS. 1a-d, a heat generating structure 10, such as a chip 14 (i.e., a flip chip, a die, etc.) attached to a multi-layer carrier 12 (e.g., a plastic ball grid array structure), inherently warps because of the mismatch of coefficients of thermal expansion (CTE) between the flip chip 14 (e.g., having a CTE of approximately 3 ppm/° C.) and the multi-layer carrier 12 (e.g., having a CTE of approximately 17 ppm/° C.). At a predetermined temperature range (e.g., less than 125° C.) the heat generating structure 10 can warp as much as 100 microns (μm) and more typically between 50 μm and 75 μm (see FIG. 1a) creating a curved surface 15. Flat thermally conductive plates 20 (i.e., heat spreaders, lids, etc.) comprising highly conductive essentially rigid structures are typically bonded to the heat generating structure 10 with a thermally conductive adhesive 18 to form an integrated circuit structure 1 (e.g., a chip package). Such a flat thermally conductive plate 20 is often attached to a heat generating structure by using a high performance thermally conductive adhesive 18 (see FIG. 1b). These types of adhesives 18 must be cured, for example, at temperatures greater than approximately 125° C. and preferably at a temperature of approximately 150° C. (see FIG. 1c). High curing temperatures (e.g., between 125° C. and approximately 165° C.) cause the heat generating structure 10 to reach a stress-free state and flatten out (i.e., bend back to form a flat surface 17). Thus, a uniform gap 21 that is filled with the adhesive 18 is achieved between the flat thermally conductive plate 20 and the flat chip surface 17 of the heat generating structure 10 during the cure process. However, when the package 1 is cooled back to a temperature within a normal operating range for the chip 14 (i.e., to within a predetermined temperature range), the heat generating structure 10 again warps and a non-uniform gap 22 is formed between the plate 20 and the heat generating structure 10. The warping is opposed by the flat thermally conductive plate 20 and a strain 19 is place upon the thermal adhesive 18 within the non-uniform gap 22. Specifically, strain 19 is placed upon the adhesive 18 within the gap 22 at the perimeter 23 of the chip 14 (see FIG. 1d). For example, a strain 19 placed upon an adhesive 18 with a modulus between 1000 and 3000 psi disposed within a non-uniform gap 22 to adhere a flat plate 20 to a curved heat generating structure 10 can be greater than 100%. This strain 19 can exceed the elongation to break for most adhesives 18. If the adhesive 18 does tolerate the strain 19, the non-uniform gap 22 can impact thermal performance and reliability as well as mechanical reliability of the thermally conductive plate 20.

This disclosure presents two unique thermally conductive plates configured such that when they are bonded with a heat generating structure and are within a predetermined temperature range, a uniform gap filled with thermally conductive adhesive is formed between the heat generating structure and the thermally conductive plate. Additionally, this disclosure presents the associated methods of forming the thermally conductive plates and the associated methods of bonding the respective thermally conductive plates to a heat generating structure. In the one embodiment of the structure and method, the thermally conductive plate is domed and modeled to match the curved surface of heat generating structure. A controlled curing method is used to achieve the uniform adhesive-filled gap between the thermally conductive plate and curved surface of the heat generating structure when the structure is within a predetermined temperature range. In another embodiment of the structure and method, the thermally conductive plate is configured to undergo the same warpage under a thermal load as the heat generating structure in order to achieve and maintain a uniform adhesive-filled gap between the heat generating structure and the plate under any temperature.

Figure 2:
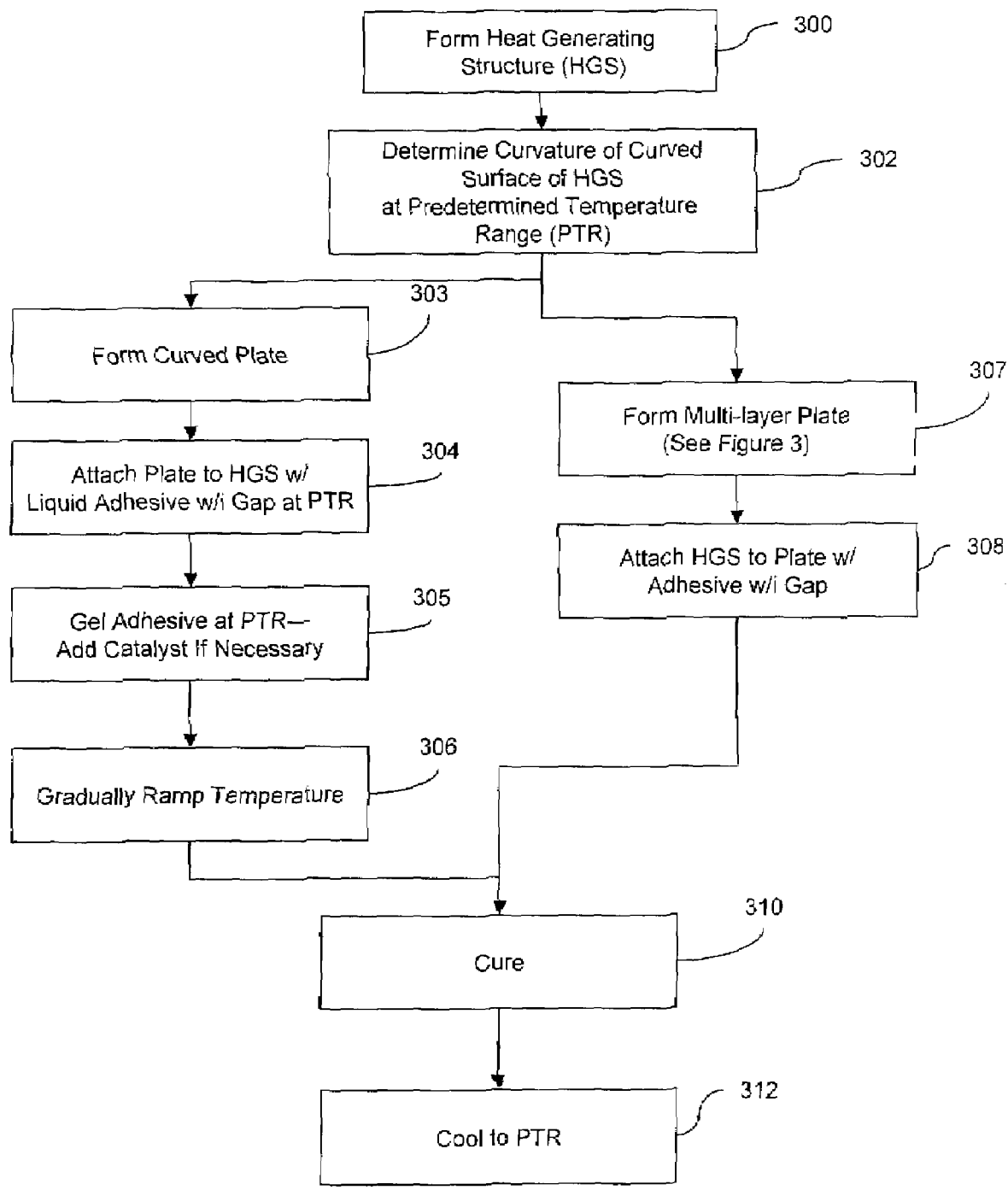
FIG. 2 is a flow diagram illustrating a method of the present invention.

Referring to FIG. 2, both embodiments of the invention comprise forming a heat generating structure 10 (300, see FIG. 1a) and determining a curvature 25 of the curved surface 15 of the heat generating structure 10 when the heat generating structure 10 is subjected to a predetermined temperature range (e.g., a temperature within a normal operating temperature range for the chip 14) (302). Determining the dimensions can be accomplished by modeling and/or measuring the curved chip surface 15. For example, dome calculations using the height of the curvature, the radius of the curvature, the perimeter 23 of the chip 14, etc., may be used to determine the dimensions of the curvature 25 of the curved surface 15. Note that for a given heat generating structure, measurements have shown that the warpage variation from sample to sample can be very small, less than one percent standard deviation. Based upon these dimensions, a thermally conductive plate structure 100 (303) or a thermally conductive plate structure 200 (307) can be formed.

Figure 4:
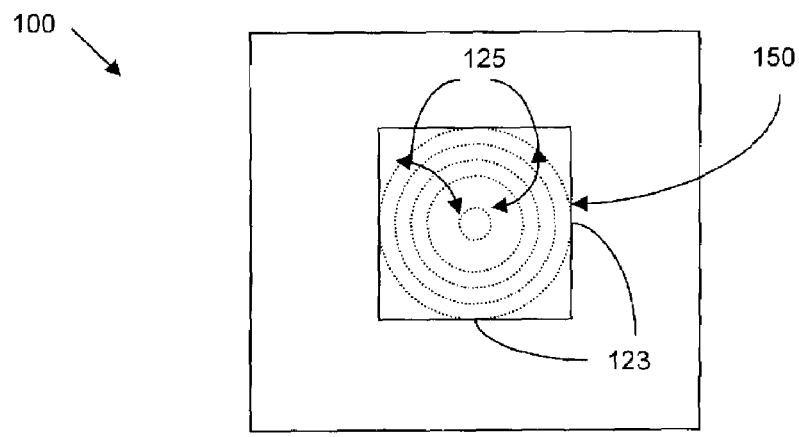
FIG. 4 is a bottom view illustration of a thermally conductive plate structure 100 formed at process 303 of FIG. 2.
Figure 5:
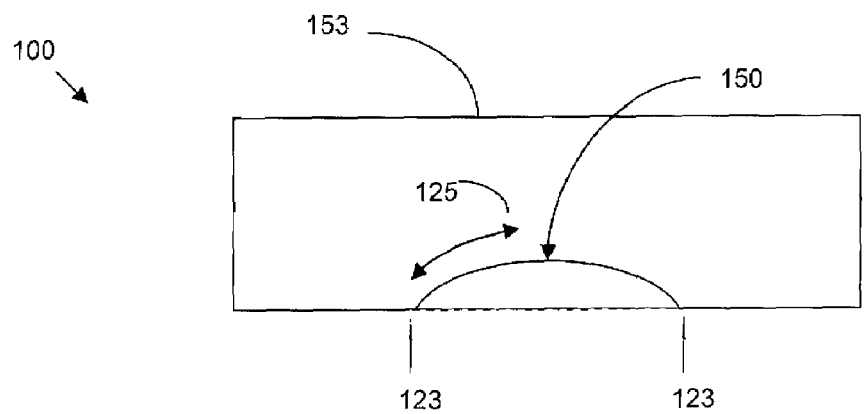
FIG. 5 is a side view cross-section illustration of a thermally conductive plate 100 with a flat top surface formed at process 303 of FIG. 2.
Figure 6:
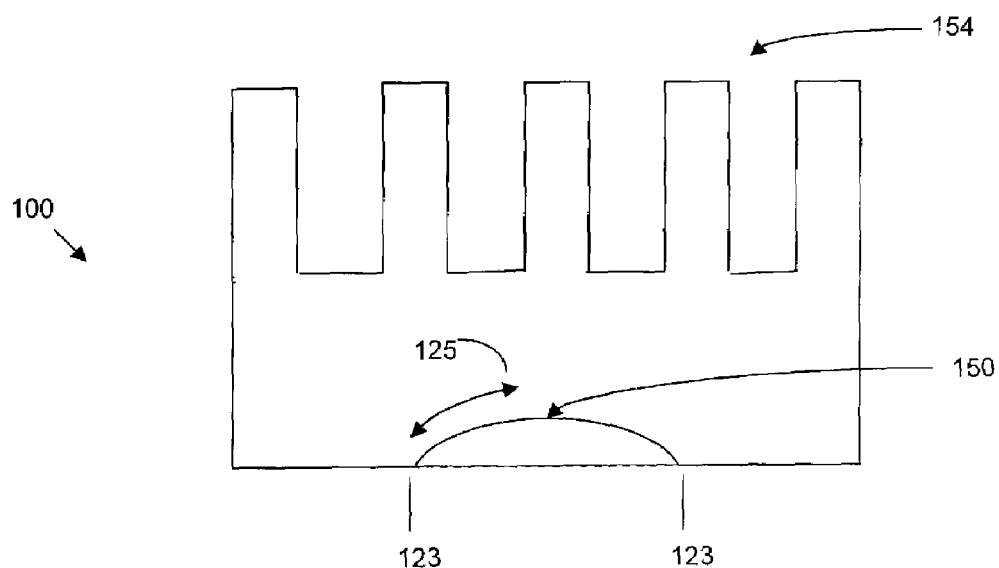
FIG. 6 is a side view cross-section illustration of a thermally conductive plate 100 with a finned top surface formed at process 303 of FIG. 2.

The thermally conductive plate 100 (e.g., heat spreader, lid, etc.) comprises a conductive essentially rigid flat monolithic single layer structure that has a curved portion 150 adapted for receiving a thermal adhesive 18 (303, see FIGS. 4-6). As shown in FIG. 5, the plate 100 may be formed with a flat top surface 153 adapted for bonding with a heat sink (not shown). Alternatively, as shown in FIG. 6, the plate 100 may be machined or cast to have fins 154, thereby creating an extended surface heat sink which would serve as a heat sink itself. The plate 100 can be formed of a highly conductive material such as copper. The curved portion 150 may be machined, coined, stamped, or otherwise formed in the structure 101 so that it is modeled to match a curved surface 15 of a heat generating structure 10. More particularly, the curved portion 150 of the plate 100 is formed such that it comprises an outer edge 123 that corresponds to the perimeter 23 of a curved surface 15 of a heat generating structure 10 (e.g., to match the perimeter 23 of a curved surface 15 of a chip 14 on a carrier 12). The curvature 125 of the curved portion 150 is formed such that it matches the curvature 25 of the curved surface 15 of the heat spreader 10. The curved portion 150 is then thermally bonded to the curved chip surface 15 of the heat generating structure 10 forming an integrated circuit structure 101 (e.g., a chip package). The curved portion 150 of the plate 100 is configured such that when the heat generating structure 10 is subjected to the a temperature within the predetermined temperature range and warps, a uniform adhesive-filled gap 121 bonds the curved portion 150 of the plate 100 and the curved surface 15 of the heat generating structure 10.

Figure 7:
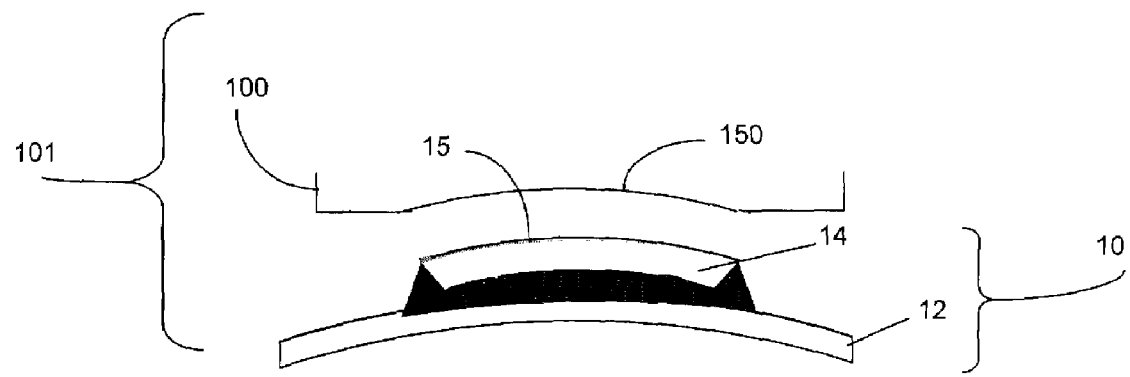
FIGS. 7-9 are schematic illustrations of a partially completed integrated circuit structure 101 of the present invention.
Figure 8:
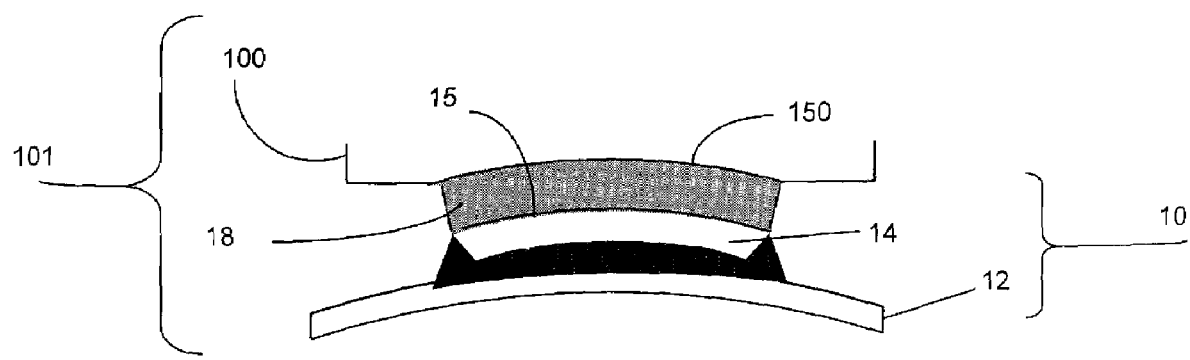
Figure 9:
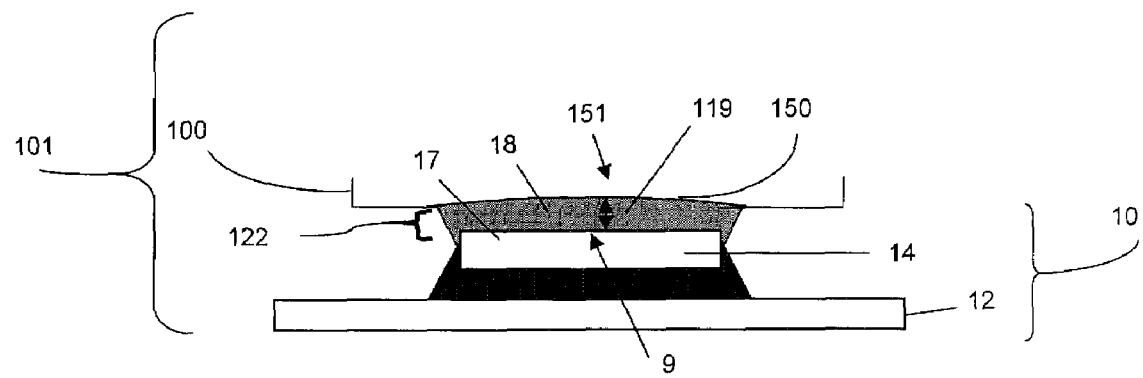
Figure 10:
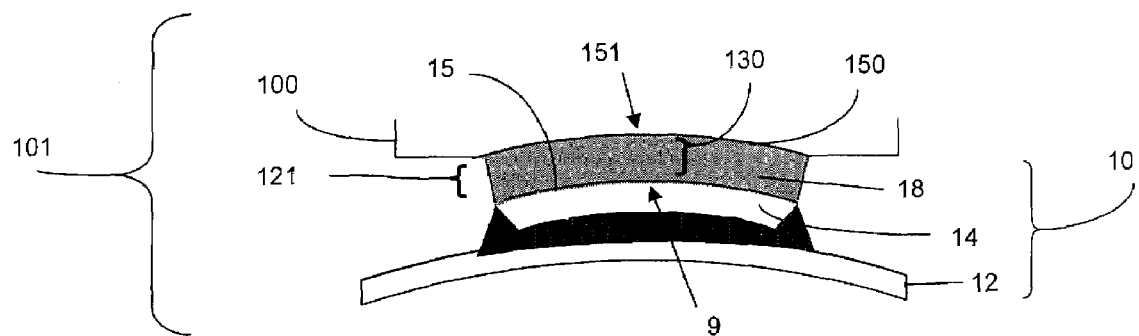
FIG. 10 is a schematic illustration of a completed integrated circuit structure 101 of the present invention.

More particularly, in order to bond the heat generating structure 10 to the thermally conductive plate 100, a liquid thermal adhesive 18 is dispensed within a gap between the curved portion 150 of the thermally conductive plate 100 and the curved chip surface 15 at a temperature within the predetermined temperature range (e.g., within the normal operating temperature of the chip 14) (304, see FIGS. 7-8), thereby forming an a uniform adhesive-filled gap 121 between the plate 100 and the heat generating structure 10. The liquid thermal adhesive 18 is selected such that it has a curing temperature that is approximately equal to a temperature (i.e., stress free reference temperature) at which the heat generating structure 10 flattens out forming a flat surface 17. The liquid thermal adhesive 18 is gelled at a selected temperature within the predetermined temperature range (e.g., less than approximately 125° C. (305). A catalyst may be added to the liquid thermal adhesive 18 to speed up the gelling process (e.g., to less than 4 hours and preferably to less than 1 hour). After the liquid thermal adhesive 18 has gelled, it is cured (310, see FIG. 9). In order to cure the adhesive 18, the temperature of the adhesive 18 is gradually increased (i.e., ramped) from the selected gelling temperature to the curing temperature (e.g., between 125° C. and approximately 165° C.) (306). During the temperature ramp, curing begins and adhesion develops. The temperature ramp (306) is controlled so that adequate adhesion will resist the tensile stresses 119 that will exist at the center 9 of the heat generating structure 10. Specifically, referring to FIG. 9, as the adhesive 18 is cured, the heat generating structure 10 reaches its stress free temperature and the chip surface becomes flat 17. As the heat generating structure 10 flattens out, a non-uniform adhesive-filled gap 122 is formed because the center 9 of the heat generating structure 10 pulls away from the center 151 of the curved portion 150 of the thermally conductive plate 100. A strain 119 (i.e., tensile stress) is created in the adhesive 18 between the center 151 of the curved portion 150 of the plate 100 and the center 9 of the flat surface 17 of the heat generating structure 10. Avoiding an abrupt temperature change to the curing temperature (at process 306) prevents damage to the adhesive 18 filling the uneven gap 122. Once the adhesive 18 is cured, it is cooled back to a normal operating temperature (e.g., less than 125° C.) (312, see FIG. 10). Upon cooling, the heat generating structure 10 again warps such that the center 9 of the chip 14 moves towards the center 151 of the curved portion 150 of the plate 100 and a uniform adhesive-filled gap 121 is formed.

An integrated circuit structure 101 (e.g., a chip package) that is formed in this manner comprises a thin uniform adhesive-filled gap 121 between the thermally conductive plate 100 and the curved chip surface 15 of the heat generating structure 10 when the circuit 101 is subjected to a predetermined temperature range. This uniform gap 121 reduces strain on the adhesive 18 and thereby improves both mechanical reliability and thermal reliability and performance. The minimum thickness 130 of the uniform adhesive-filled gap 121 cannot be reduced below the maximum particle size of the interface material. However, if the gap 121 can be made uniform at the minimum level, thermal performance will be maximized. Referring to the chart of FIG. 15 in combination with FIG. 10, the positive impact of gap uniformity on the package 101 thermal performance metric Theta-jc. Specifically, the thickness 130 of the gap is measured from the center 9 of the heat generating structure 10 to the center 151 of the curved portion 150 of the thermally conductive plate 100 and also from the edges 23 of the heat generating structure 10 to the center 151. As the thickness increases so does the resistance. Thus, minimum package resistances can be achieved with a uniform gap (i.e., bondline (BL)) 121 (e.g., corresponding to the Outside BL/Center BL=1 on the x-axis), having a minimum thickness 130.

Figure 1D:
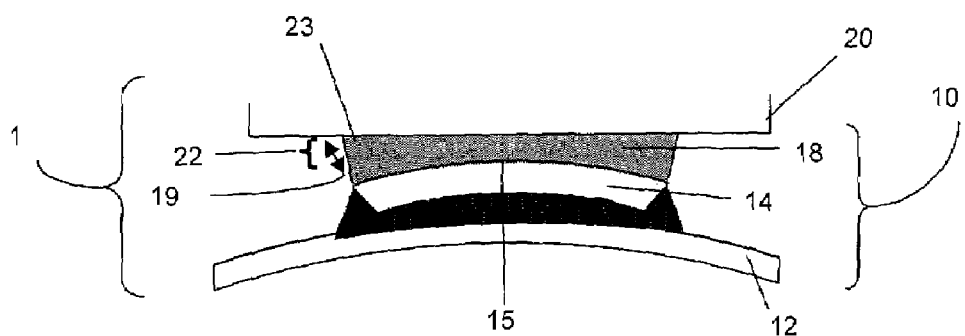
Figure 11:
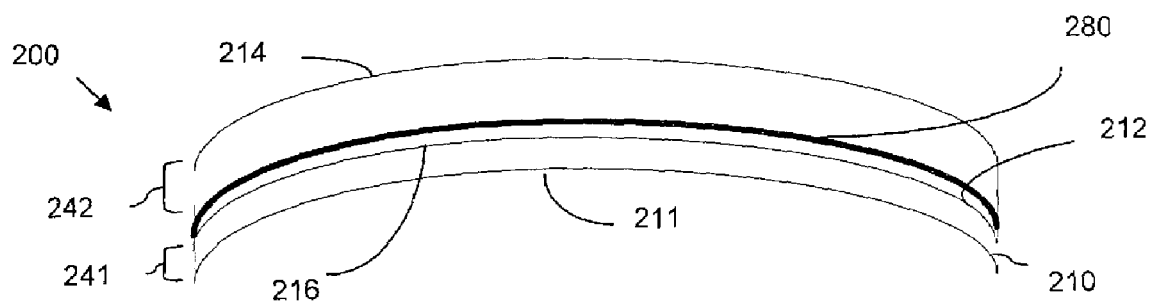
FIG. 11 is a side view cross-section illustration of a thermally conductive plate 200 formed at process 307 of FIG. 2.
Figure 14:
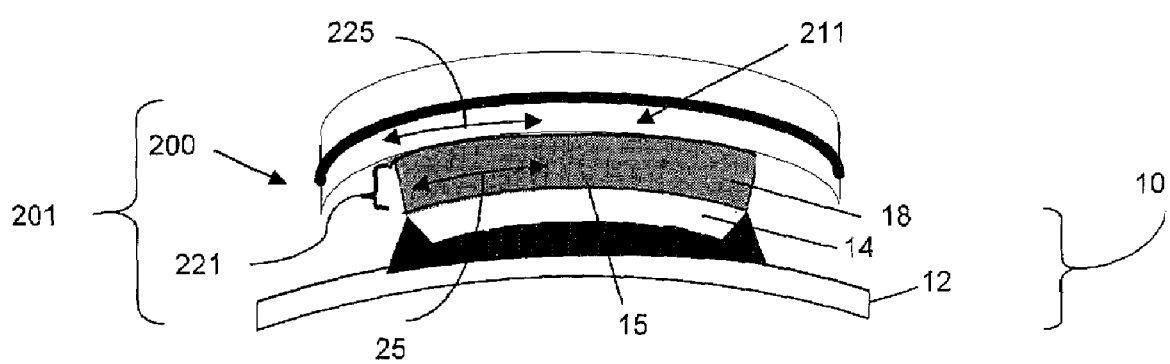
FIG. 14 is a schematic illustration of a completed integrated circuit structure 201 of the present invention.

Again referring to FIG. 2, in another embodiment, based upon the dimensions determined at process 302, a thermally conductive plate 200 is formed (307, see FIG. 11). The thermally conductive plate 200 is configured to warp in a similar manner as the heat generating structure 10. Since the top surface 214 of the heat spreader 200 also curves, the adhesive used to attach the heat spreader 200 to a heat sink (not shown) is stressed as opposed to the adhesive 18 between the curved chip surface 15 and a flat heat spreader 20 (as shown in FIG. 1d). However, because the surface area between the heat spreader 200 and a heat sink is much larger, an equally thick interface material (e.g., adhesive) will produce lower thermal resistance between the larger contact area for the heat sink versus the smaller area between the chip 14 and lid 200. The thermally conductive plate 200 comprises a multi-layer composite structure made of high and low CTE materials, such as copper, silicon carbide, aluminum nitride, diamond, etc. The warpage can be controlled by the thicknesses of the layers and the choice of materials. The warpage can be made to match the heat generating structure 10 at all temperatures by attaching the composite materials at the same stress free reference temperature (i.e., temperature at which the structure becomes flat) as that of the heat generating structure 10 (see FIG. 1a) (e.g., the curing temperature of 150° C.). Since the thermally conductive plate 200 can have the same warpage as the heat generating structure 10, the gap 221 that is achieved when the thermally conductive plate 200 is attach to the chip 14 with a thermally conductive adhesive 18 is very uniform (see FIG. 14 discussed below). This will minimize the required overall thickness of the adhesive-filled gap 221 with any particular interface material. The result is minimal interface resistance and more uniform cooling of the heat generating structure 10.

Figure 3:
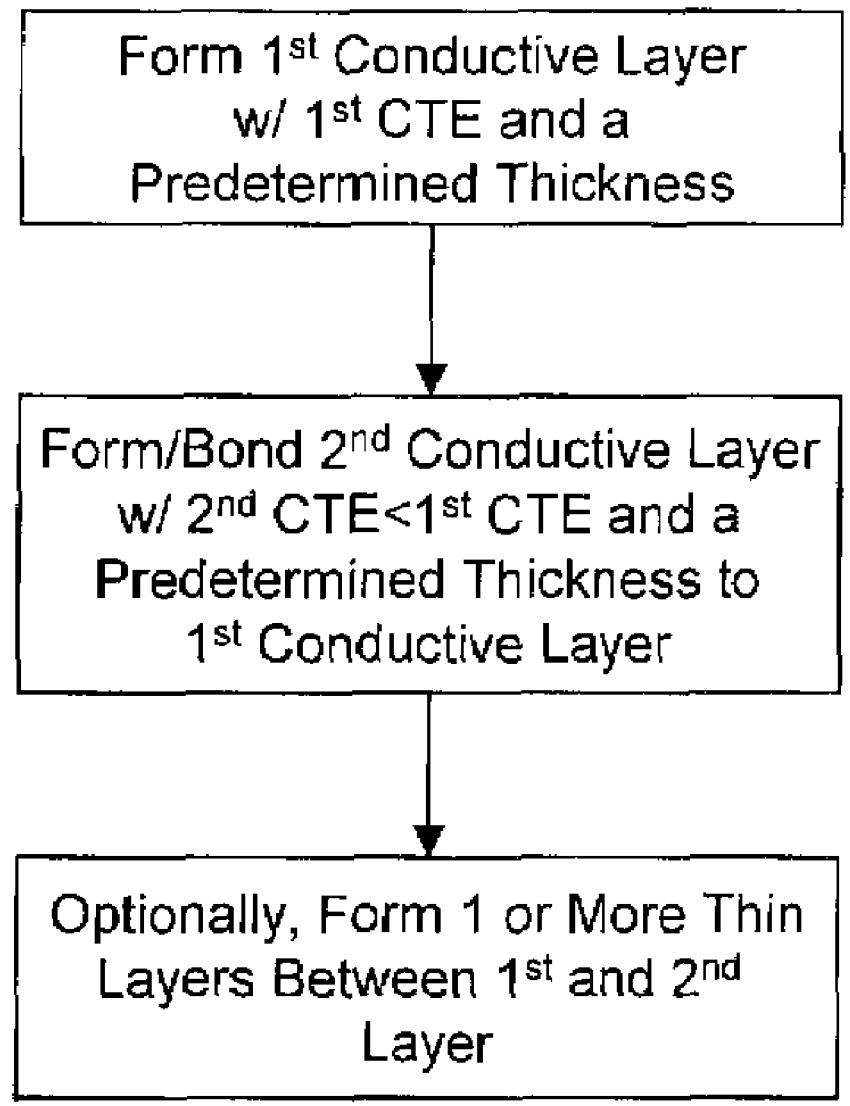
FIG. 3 is a flow diagram illustrating process 304 of FIG. 2.

More particularly, the thermally conductive plate 200 is a multi-layer conductive structure 202 that is configured to bend (i.e., warp) in a similar manner as the heat generating structure 10 in response to varying temperatures, including a predetermined temperature range within which the structure 10 warps (e.g., the operating temperature range) and a stress free reference temperature at which the structure 10 flattens out. Referring to the flow diagram of FIG. 3 in conjunction with FIG. 11, the thermally conductive plate 200 comprises a first conductive layer 210 having a curved first surface 211 within a predetermined temperature range, a flat first surface 217 at a curing temperature (see FIG. 13), and a second surface 212 (402). The multi-layer structure 200 (i.e., thermally conductive plate) also comprises a second conductive layer 214 that can be bonded onto the second surface 212 of the first conductive layer 210 (404). The layers 210, 214 may be bonded together using a thermally conductive adhesive 280, or directly bonded (e.g., by friction welding, sputtering, or plating of one material onto the other). The conductive layers 210, 214 are selected such that the coefficient of thermal expansion of the second conductive layer 214 is less than that of the first conductive layer 210. The high conductivity of the thermally conductive plate 200 can be achieved by using a thick layer (e.g., 0.5 mm or thicker) of copper as the first conductive layer 210. Exemplary second conductor materials with a lower CTE can include silicon carbide, aluminum silicon carbide, aluminum nitride, diamond, etc. If a thermally conductive adhesive 280 is used to bond the two conductive layers 210 and 214 together, the adhesive 280 should be selected such that it has a glass transition temperature (Tg) that is approximately equal to a temperature at which the heat generating structure 10 flattens out (i.e., the stress free reference temperature of the heat generating structure 10) and is above the predetermined temperature range. If the glass transition temperature of the adhesive 280 is chosen to match the stress free reference temperature of the heat generating structure 10 (e.g., approximately 150° C.), the thermally conductive plate 200 will warp at the same temperatures as the heat generating structure 10. The conductive layers 210 and 214 can be bonded together using a thermal interface material (i.e., thermal adhesive 280) with a high modulus (e.g., greater than 0.5 Mpsi).

Figure 15:
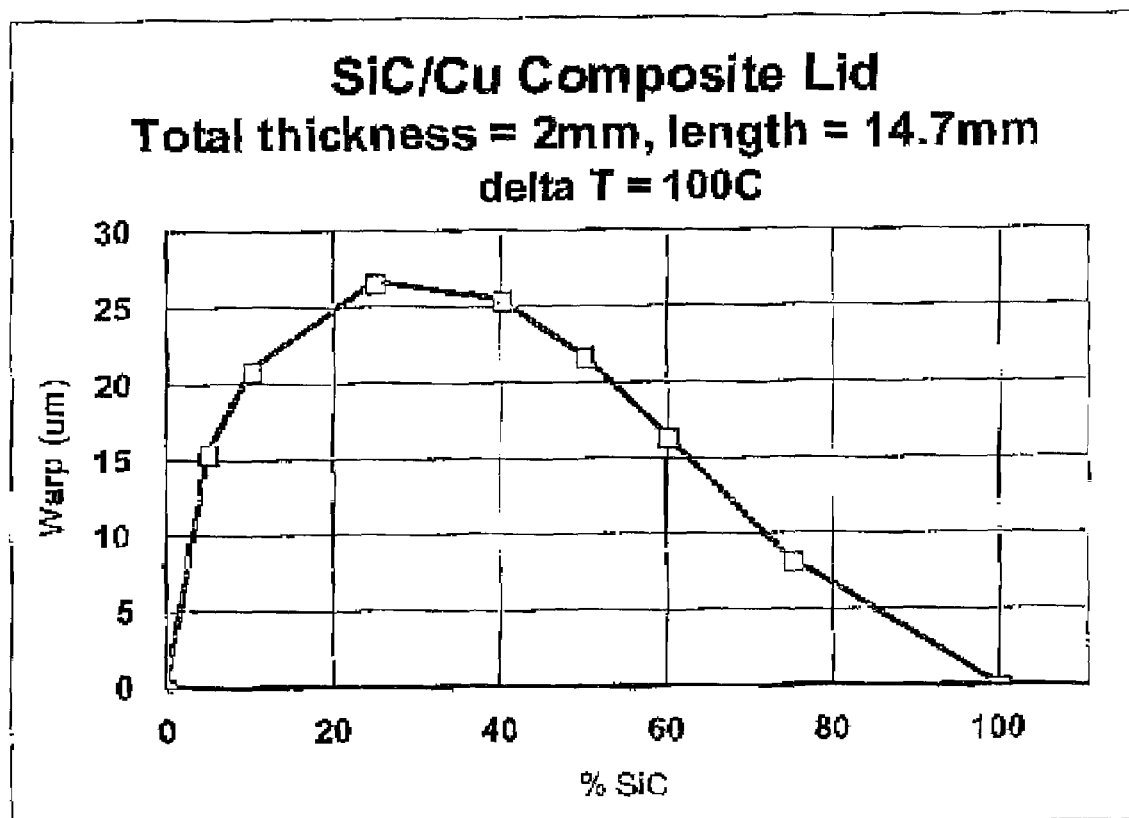
FIG. 15 is a graph illustrating warpage values for exemplary thermally conductive plates 200 of FIG. 11.
Figure 16:
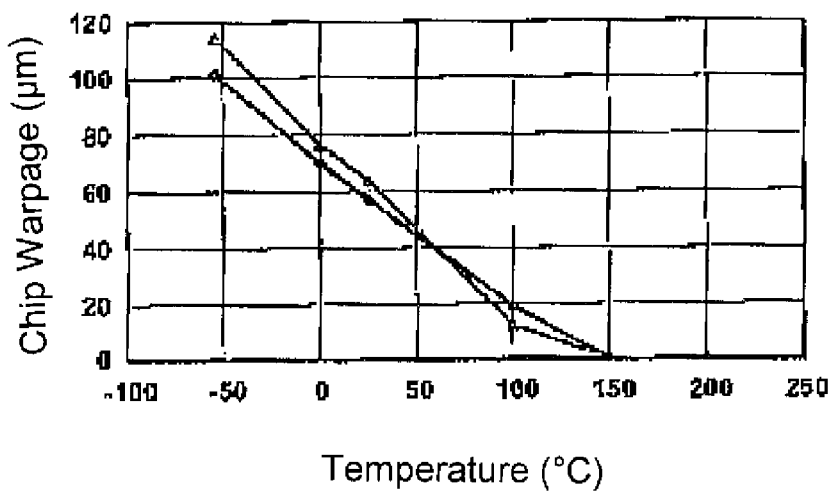
FIG. 16 is a graph illustrating temperature dependant warpage values for an exemplary heat generating structure.
Figure 17:
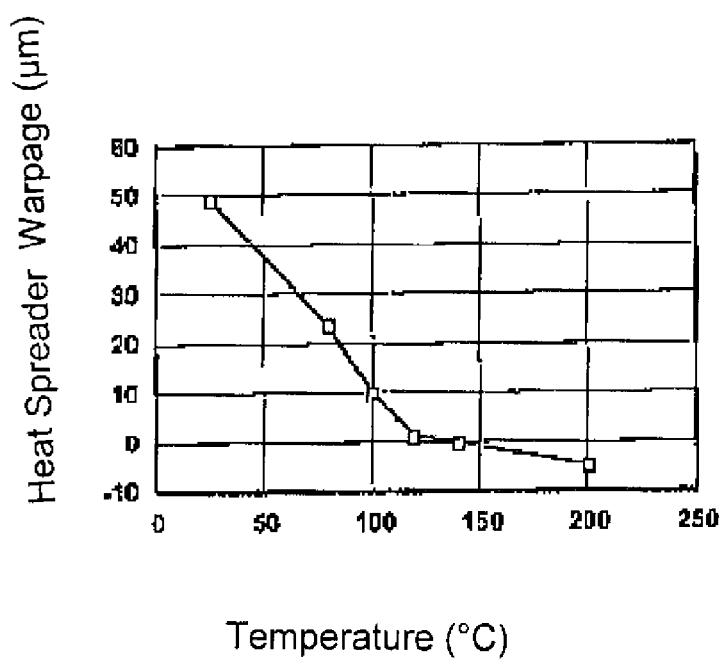
FIG. 17 is a graph illustrating temperature dependant warpage values attainable by an exemplary thermally conductive plate 200 of FIG. 11; and, FIG. 18 is a graph illustrating the effect of bondline uniformity and thickness on resistance.
Figure 18:
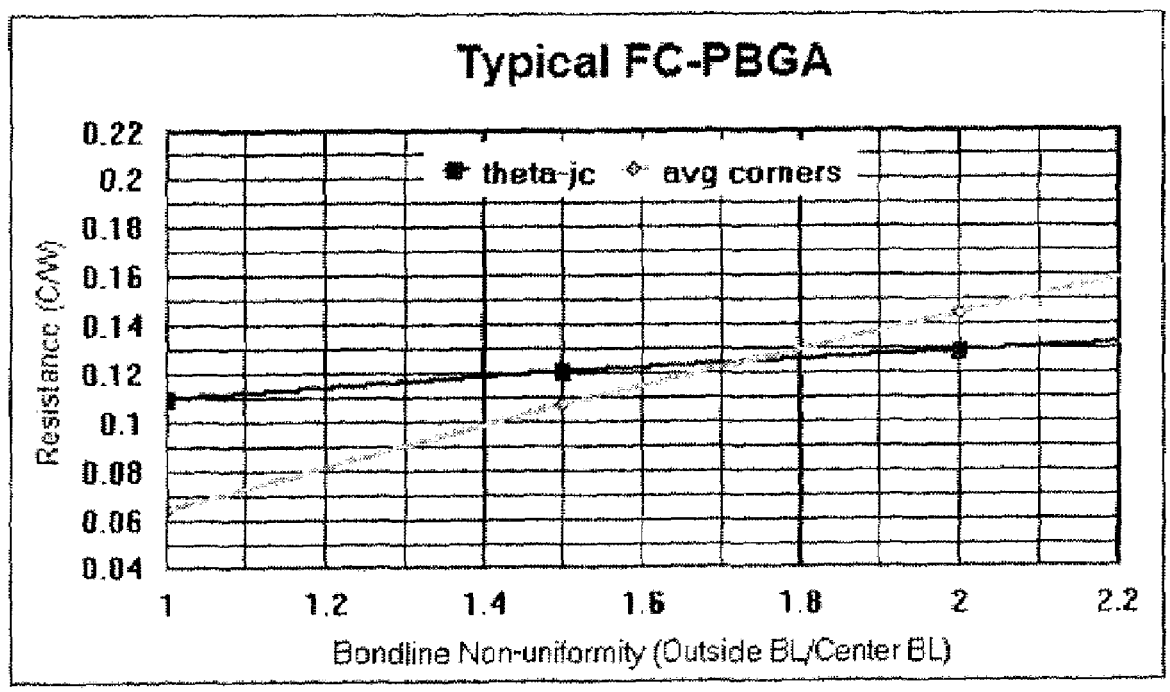

The layers 210, 214 of the thermally conductive plate 200 are configured such that they bend in a similar manner as the heat generating structure 10 in response to varying temperatures. Specifically, the plate 200 is configured such that within the predetermined temperature range the curvature 225 of the plate 200 at the curved first surface 211 matches the curvature 25 of the curved surface 15 of the heat generating structure 10 and such that at the curing temperature (or stress free reference temperature) both the plate 200 and the heat generating structure 10 flatten out (see surfaces 217 and 17 of FIG. 13, discussed below). The manner in which the multi-layer structure 200 bends in response to varying temperatures is a function of the differences between the predetermined thicknesses 241, 242, respectively, of each conductive layer 210, 214, the differences between the coefficients of thermal expansion (CTE) of each of conductive layer 210, 214, and the material properties of any adhesive 280 used to bond the layers 210, 214 (e.g., modulus, CTE, Tg, etc.). For example, FIG. 15 is a graph illustrating the different warpage levels that may be achieved based upon different thicknesses of first 210 and second 214 conductive layers of a thermally conductive plate 200. Specifically, FIG. 15 illustrates exemplary warpage results for different thermally conductive plates 200 each being 2 mm thick and 14.7 mm long, each having different thicknesses of copper (first conductive layer 210) and silicon carbide (second conductive layer 214), and each modeled with a change in temperature of 100° C. The greatest warpage (e.g., approximately 25 microns) was achieved when the structure 200 comprised between 20 and 40 percent silicon carbide. FIGS. 16 and 17 are graphs of experimental results illustrating that similar chip 14 and thermally conductive plate 420 warpage may be achieved at the same temperatures. For example, a thermally conductive plate 200 can be configured, as described above, to achieve approximately 40 microns of warpage at 50° C. to match the chip 14 warpage at the same temperature.

Again referring to FIG. 3 in combination with FIG. 11, for lower thermal resistance between the first and second conductive layers 210, 214, the thermally conductive plate 200 may also comprise at least one relatively thin additional conductive layer 216 formed in between the first conductive layer 210 and the second conductive layer 214 (406). If an additional conductive layer 216 is deposited onto the first conductive layer 210, then the second conductive layer 214 is bonded to the additional conductive layer 216. The additional conductive layer 216 can be selected such that is has a different (e.g., lower) coefficient of thermal expansion relative to that of the first 210 and second conductive 214 layers. The additional conductive layer 216, thereby, lowers the thermal resistance between the first 210 and second 214 conductive layer. An additional conductive layer 216 having a thickness of less than, for example, approximately 0.1 microns can be deposited directly onto second surface 212 of the first conductive layer 210 by either a sputtering technique or by an evaporation technique. An additional conductive layer 216 having a thickness of greater than approximately 0.1 micron may be formed on the second surface 212 of the first conductive layer 210 by applying a sol-gel process. If sol-gel processing is used, the lower CTE coating 216 can be designed with a CTE gradient to manage the stresses at the copper 210 interface.

Figure 12:
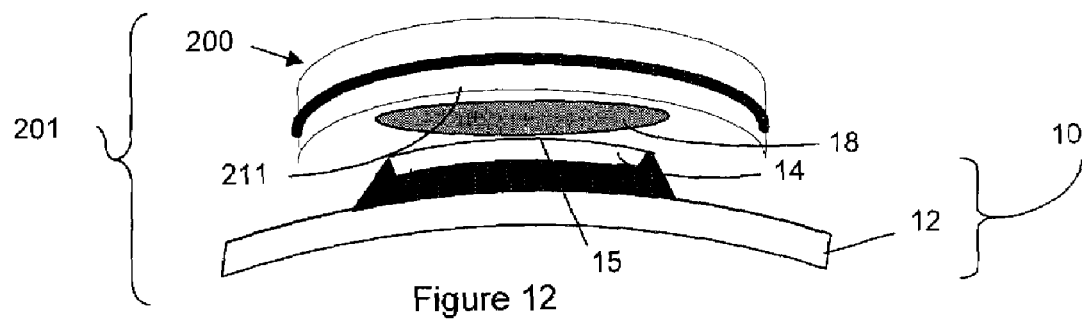
FIGS. 12-13 are schematic illustrations of a partially completed integrated circuit structure 201 of the present invention.

Referring back to FIG. 2, once the thermally conductive plate 200 is formed it is thermally bonded to the heat generating structure forming an integrated circuit structure 201 (e.g., chip package) (308, see FIG. 12). A thermally conductive adhesive 18 is deposited into a gap between the curved surface 211 of the thermally conductive plate 200 and the curved surface 15 of the heat generating structure 10 (see FIG. 12) within the predetermined temperature range.

Figure 13:
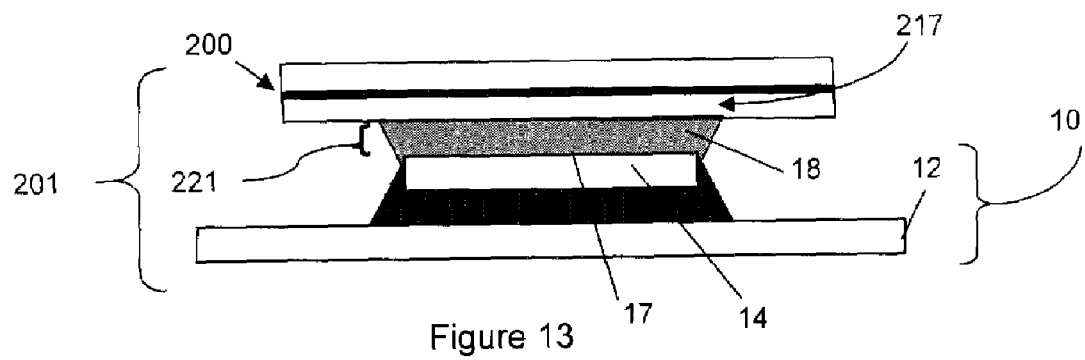

The adhesive 18 is then cured (310, see FIG. 13). Due to the configuration of the thermally conductive plate 200 at the curing temperature both the heat generating structure 10 and the thermally conductive plate 200 flatten (see surfaces 17 and 217 of FIG. 13, respectively) such that a uniform adhesive-filled gap 221 is formed between the flat surfaces 17 and 217. After curing the adhesive 280, the structure 201 is cooled (e.g., to a temperature within said predetermined temperature range) and bends such that the uniform adhesive-filled gap 221 between the curved surface 211 of the thermally conductive plate 200 and the curved surface 15 of the heat generating structure 10 is maintained (312, see FIG. 14).

An integrated circuit structure 201 that is formed according to this method will have a uniform adhesive-filled gap 221 between the thermally conductive plate 200 and the heat generating structure 10 regardless of the temperature variations. Such a uniform thermally conductive adhesive-filled gap 221 will minimize the required overall thickness of the thermally conductive adhesive 18 for any particular interface material. The result is minimal interface resistance and more uniform cooling of the heat generating structure 10. Furthermore, because of the reduced stress to the adhesive 18 within the gap 221 different types of thermally conductive adhesives may be used to bond the thermally conductive plate 200 to the heat generating structure 10. For example, stiff epoxies that exhibit very good thermal properties may be used to bond the thermally conductive plate 200 to the heat generating structure 10 without stress concerns.

Therefore, disclosed above are two unique thermally conductive plates. Each plate is configured such that a uniform adhesive-filled gap may be achieved between the plate and a heat generating structure when the plate is bonded by a thermally conductive adhesive to the heat generating structure and subjected to a temperature within a predetermined temperature range that causes the heat generating structure to warp. Additionally, this disclosure presents the associated methods of forming the thermally conductive plates and of bonding the plates to the heat generating structure. In the one embodiment of the structure and method, the thermally conductive plate is domed (i.e., curved) and modeled to match the curved surface of the heat generating structure within the predetermined temperature range. The method of bonding the plate to the heat generating structure to attain the uniform adhesive-filled gap at a temperature within the predetermined temperature range incorporates a controlled curing process to reduce stress on the adhesive. In another embodiment of the structure and method, the thermally conductive plate is a multi-layer conductive structure that is configured to undergo the same warpage under a thermal load as the heat generating structure. Thus, when the thermally conductive plate is bonded with the heat generating structure it is able to achieve and maintain a uniform adhesive-filled gap at any temperature. A uniform adhesive-filled gap so achieved improves not only thermal performance and reliability, but also mechanical reliability because the adhesive within the gap remains stress free.

While the invention has been described in terms of preferred embodiments, those skilled in the art will recognize that the invention can be practiced with modification within the spirit and scope of the appended claims.

What is claimed is:

1. A thermally conductive structure comprising:
   a thermally conductive plate adapted to be connected to a heat generating structure by a thermally conductive adhesive,
   wherein said heat generating structure bends in response to varying temperatures,
   wherein said plate is adapted to bend in response to said varying temperatures in a similar manner as said heat generating structure such that a curvature of said plate matches a curvature of said heat generating structure,
   wherein said plate comprises a multi-layer structure comprising:
      a first conductive layer, having a first coefficient of thermal expansion, comprises said bonding surface and a second surface; and,
      a second conductive layer, having a second coefficient of thermal expansion, bonded onto said second surface of said first conductive layer, and
   wherein said second coefficient of thermal expansion is less than said first coefficient of thermal expansion such that in response to said varying temperatures said multi-layer structure bends; and
   at least one additional conductive layer bonded between said first conductive layer and said second conductive layer, wherein said additional conductive layer has a lower coefficient of thermal expansion relative to said first conductive layer and said second conductive layer and thereby lowers a thermal resistance between said first conductive layer and said second conductive layer.

2. The structure of claim 1, further comprising another thermally conductive adhesive, having glass transition temperature, bonding said first conductive layer to said second conductive layer,
   wherein said heat generating structure becomes flat in response to a temperature above said predetermined temperature range and wherein said glass transition temperature is approximately equal to said temperature at which said heat generating structure becomes flat.

3. The structure of claim 1, wherein a gap between said heat generating structure and said plate is filled with said adhesive and remains uniform as said heat generating structure and said plate bend in response to said varying temperatures.

4. The structure of claim 1, wherein each of said conductive layers of said multi-layer structure has a predetermined thickness, and wherein said multi-layer structure bends as a function of the differences between said predetermined thicknesses of each of said conductive layers and as a function of the differences between said coefficients of thermal expansion of each of said conductive layers.

5. A method of forming a thermally conductive plate, said method comprising:
   determining a curvature of a heat generating structure when said heat generating structure bends in response to a predetermined temperature range; and
   forming a thermally conductive plate adapted to bend in response to said predetermined temperature range in a similar manner as said heat generating structure such that a curvature of said plate matches a curvature of said heat generating structure within said predetermined temperature range,
   wherein bending of said plate allows a uniform gap to be formed between said thermally conductive plate when said heat generating structure is in said predetermined temperature range,
   wherein said forming of said thermally conductive plate comprises:
      forming a first conductive layer, having a predetermined thickness and coefficient of thermal expansion; and bonding a second conductive layer, having a predetermined thickness and a coefficient of thermal expansion, to said first conductive layer, and wherein said thermally conductive plate bends as a function of a difference in said predetermined thicknesses between said first conductive layer and said second conductive layer and as a function of a difference in said coefficients of thermal expansion between said first conductive layer and said second conductive layer.

6. The method of claim 5, wherein said heat generating structure bends in response to varying temperatures within and outside said predetermined temperature range and, particular, becomes flat at a temperature above said predetermined temperature range, wherein said forming of said thermally conductive plate further comprises forming said thermally conductive plate such that said plate is further adapted to additionally bend in response to said varying temperatures in a similar manner as said heat generating structure, and wherein said additional bending of said plate allows a uniform gap to be maintained between said thermally conductive plate and said heat generating structure when said heat generating structure is bonded by said thermally conductive adhesive to said thermally conductive plate and is subjected to said varying temperatures.

7. The method of claim 6, wherein said heat generating structure becomes flat at a temperature above said predetermined temperature range, and wherein said using of said thermally conductive comprises:

selecting said thermally conductive adhesive to have a glass transition temperature that is approximately equal to said temperature above said predetermined temperature range at which said heat generating structure becomes flat;

dispensing said thermally conductive adhesive between said first conductive layer and said second conductive layer; and curing said thermally conductive adhesive.

8. The method of claim 5, wherein said bonding of said second conductive layer to said first conductive layer comprises one of using a thermally conductive adhesive to adhere said first conductive layer and said second conductive layer, friction welding said second conductive layer onto said first conductive layer, sputtering said second conductive layer onto said first conductive layer, and plating said second conductive layer onto said first conductive layer.

9. The method of claim 5, further comprising forming at least one additional conductive layer between said first conductive layer and said second conductive layer.

10. The method of claim 9, wherein said process of forming said at least one additional conductive layer comprises one of depositing said additional conductive layer by one of a sputtering technique and an evaporation technique to form an approximately 0.1 microns thick additional conductive layer and applying a sol-gel process to form a greater than approximately 0.1 microns thick additional conductive layer.

* * * * *